US005266843A

United States Patent [19]

Walker et al.

[11] Patent Number: 5,266,843

[45] Date of Patent: Nov. 30, 1993

[54] SUBSTRATE SLEW CIRCUIT

[75] Inventors: Darryl Walker; Daniel F. McLaughlin, both of Dallas, Tex.

[73] Assignee: Texas Instruments Incorporated, Dallas, Tex.

[21] Appl. No.: 32,740

[22] Filed: Mar. 16, 1993

Related U.S. Application Data

[63] Continuation of Ser. No. 857,895, Mar. 26, 1992, abandoned.

[51] Int. Cl.[5] ...................... H03K 3/01; H03K 17/687

[52] U.S. Cl. .............................. 307/296.2; 307/296.5; 307/296.6; 307/296.8; 307/576; 307/578; 307/585

[58] Field of Search ............... 307/296.2, 296.5-296.8, 307/481, 350, 355, 571, 576, 578, 585

[56] References Cited

FOREIGN PATENT DOCUMENTS 9008426 7/1990 World Int. Prop. O. ....... 307/296.2

OTHER PUBLICATIONS

IBM Tech. Disc. Bul. vol. 28, No. 10, Mar. 1986 "Substrate Bias Generator Utilizing Hole Extraction for Latch-up Prevention of CMOS circuitry".

*Primary Examiner*—Margaret R. Wambach
*Attorney, Agent, or Firm*—Ronald O. Neerings; James C. Kesterson; Richard L. Donaldson

[57] ABSTRACT

The described embodiments of the present invention provide a substrate slew circuit that eliminates electron injection. The slew circuit comprises a semiconductor substrate, at least one transistor and a control circuit. One of a source/drain of a first transistor in the slew circuit is connected to Vss, the other of the source/drain of the first transistor is connected to the gate and one of a source/drain of a second transistor, the other of the source/drain of the second transistor is connected to the substrate. A control circuit is connected to the gate of the first transistor for controlling the passage of voltage from the one of a source/drain of the first transistor to the substrate via the gate and the one of a source/drain of the second transistor. The sensitivity of the slew circuit can be made programmable by adding one or more more n-channel transistors in stacked diode configuration between the other of the source/drain of the first transistor and the substrate.

16 Claims, 1 Drawing Sheet

SUBSTRATE SLEW CIRCUIT

This application is a continuation of application Ser. No. 07/857,895 filed Mar. 20, 1992 now abandoned.

FIELD OF THE INVENTION

The present invention relates to the field of integrated circuitry and, more particularly, to a substrate slew circuit having reduced electron injection.

BACKGROUND OF THE INVENTION

DRAMS and many other integrated circuits require a negative NMOS substrate voltage. A negative NMOS substrate voltage lowers the junction capacitance of NMOS transistors, prevents forward biasing of p-n junctions and improves the isolation of DRAM storage cells by increasing the threshold voltage of the thick-field transistors.

A negative substrate bias is achieved by using a capacitor to pump the substrate negative through a MOS diode. A typical substrate pump can be seen in FIG. 1. Φ1 and Φ2 are 180° out of phase clock signals that oscillate between Vdd and Vss. When Φ1 is at Vdd, Φ2 is at Vss and node N1 is precharged to Vss through PMOS transistor D1. When Φ1 goes from Vdd to Vss node N1 is booted to a negative potential and its charge is transferred to the substrate through PMOS transistor D1. Node N1 going negative precharges node N2 to Vss through PMOS transistor D3. Thus we have a two phase substrate biasing pump. The substrate voltage is limited to $-Vdd+|Vtp|$, where Vtp is the threshold voltage of the PMOS diode. It can be seen that the substrate voltage is dependent upon the voltage supply Vdd.

A problem may develop when Vdd slews from a higher voltage to a lower voltage and the substrate has no discharge path to enable it to become less negatively biased. When this happens, the threshold voltages of the integrated circuits NMOS transistors are too large for optimal operation of the circuitry due to the body effect on the threshold voltages. A circuit that overcomes this problem by causing the substrate voltage to become more shallow (less negative) during slew conditions is shown in FIG. 2.

The circuit of FIG. 2 operates by comparing the negative voltage of node N1 to node N3. When the voltage on node N1 is a high voltage, the voltage on node N2 is a low voltage so NMOS transistor T1 is off and the voltage on node N3 remains the same. When the voltage on node N1 is low, the voltage on node N2 is high so node N1's low voltage is then passed to node N3. Therefore, if node N1's low voltage becomes an NMOS threshold voltage (Vtn) above Vbb (substrate voltage), NMOS transistor T2 turns on and Vbb becomes more shallow until node N1's low voltage is $\leqq Vbb+Vtn$. Since $Vbb \geqq -Vdd+|Vtp|$, Vdd must slew down by at least $|Vtp|+Vtn$ for this circuit to be effective.

A major problem with circuits that have nodes at negative voltages is the risk of forward biasing the pn junctions in the NMOS transistors. If the drain or source of an NMOS transistor, shown in FIG. 3, gets a Vtpn (the turn on voltage of a pn junction diode) below Vbb, the diode becomes conductive and electrons are injected from the more heavily doped n-type source/drain area into the more lightly doped p-type substrate. Electrons injected into the more lightly doped p-type substrate travel freely until they either recombine in the substrate or are collected by a more positively charged region such as a DRAM storage cell. These injected electrons can cause DRAM storage cells to lose a true "1" stored in them if the number of injected electrons collected by a storage cell is large enough.

Node N1 in FIG. 2 is one such problematic injection node. The node voltage oscillates between ground and $Vbb-|Vtp|$ causing the p-n diode from the source to the substrate of transistor T1 to become forward biased since Vbb is typically no deeper than $(-Vdd)+|Vtp|$. This result is undesirable. What is needed is a circuit that performs this same slew function without the risk of electron injection.

SUMMARY OF THE INVENTION

The described embodiments of the present invention provide a circuit for employing a substrate slew circuit in an integrated circuit having a substrate pump. The slew circuit boots a PMOS transistor to produce a gate voltage low enough to pass a first voltage signal from a substrate pump to the gate of a transistor having one of its source/drain coupled to the substrate and the other of its source/drain coupled to Vss.

The substrate slew circuit significantly reduces electron injection into the substrate, as compared to prior substrate slew circuits, while providing excellent slew circuit sensitivity.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

The following detailed description relates to a technique for obtaining a substrate slew circuit that overcomes the electron injection problems of prior substrate slew circuits.

Figure 1:
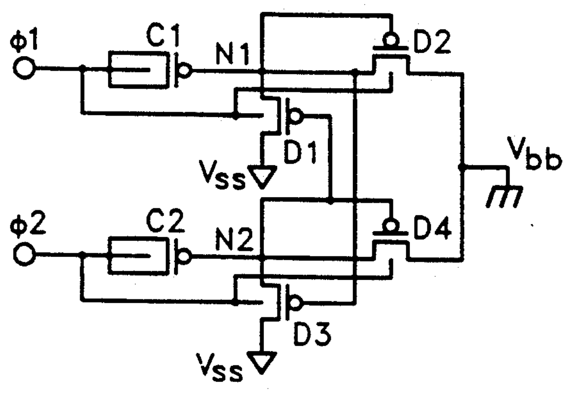
FIG. 1 illustrates in schematic form a prior art substrate pump for use in an integrated circuit.
Figure 2:
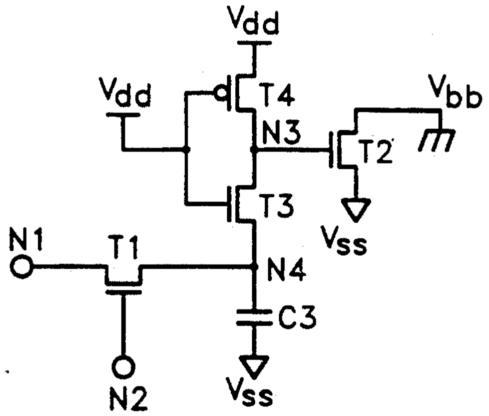
FIG. 2 illustrates in schematic form a prior art substrate slew circuit used in combination with the substrate pump of FIG. 1.
Figure 3:
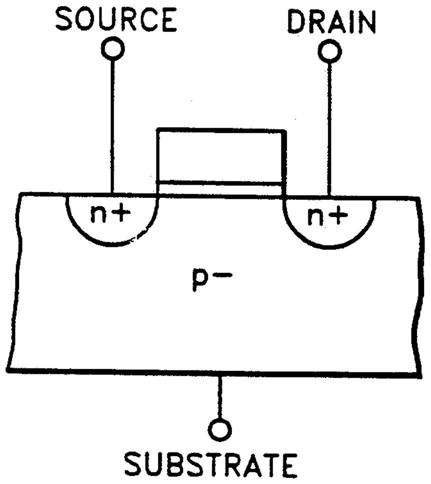
FIG. 3 illustrates a cross sectional view of an NMOS transistor.
Figure 4:
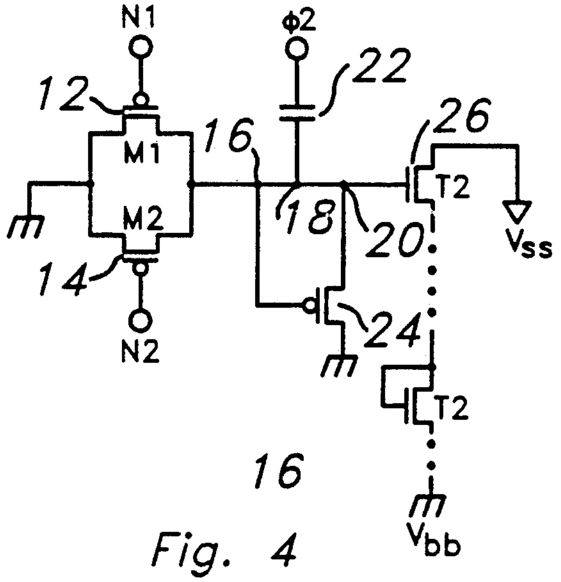
FIG. 4 illustrates in schematic form a substrate slew circuit for use in combination with the substrate pump of FIG. 1, according to one embodiment of the present invention.

The substrate slew circuit shown in FIG. 4 is used in conjunction with the substrate pump of FIG. 1. Referring to FIG. 4, one of a source/drain of PMOS transistor 12 and one of a source/drain of PMOS transistor 14 are connected to the substrate. The gate of PMOS transistor 12 is connected to node N1 of the substrate pump of FIG. 1 for receiving a first voltage signal from the substrate pump. The gate of PMOS transistor 14 is connected to node N2 of the substrate pump of FIG. 1 for receiving a second voltage signal from the substrate pump.

The other of the source/drain of PMOS transistor 12 and the other of the source/drain of PMOS transistor 14 are connected to node 16. Node 18 couples node 16 to node 20. The first plate of capacitor 22 is connected to node 18. The second plate of capacitor 22 is connected to receive the Φ2 clock signal of FIG. 1. The gate of PMOS transistor 24 is connected to node 16. One of a source/drain of PMOS transistor 24 is connected to node 20 and the other source/drain of PMOS The gate of NMOS transistor 26 is connected to node 20. One of a source/drain of NMOS transistor 26 is connected to Vss. The other of the source/drain of NMOS transistor 26 is connected to both one of a source/drain and the gate of an NMOS transistor 28 to decrease the sensitivity of the circuit. The other of the source/drain of NMOS transistor 28 is connected to the substrate. More NMOS transistors may be added in stacked diode configuration between the other of the source/drain of NMOS transistor 28 and the substrate to further decrease the sensitivity of the circuit. The voltage level of Φ2 oscillates between Vdd and ground and is in phase with the voltage signal on node N2.

Figure 5:
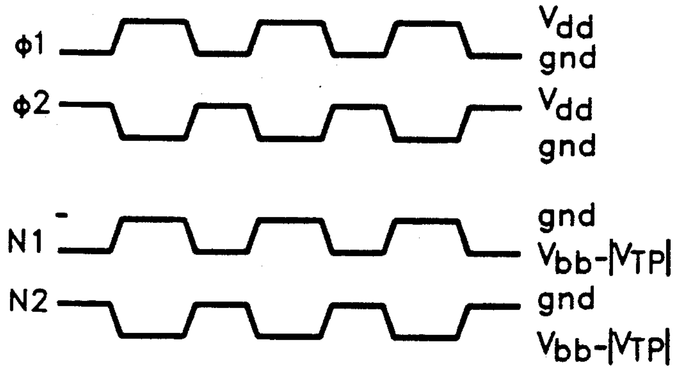
FIG. 5 illustrates in graphic form the relationship between clock signals Φ1, Φ2 and nodes N1 and N2.

The circuit of FIG. 4 operates such that when the voltage level of clock signal Φ2 goes low, the voltage level on node 20 settles at Vbb if the voltage on node N2 is at least |Vtp| below Vbb (i.e. normal non-slewing operation), or VN2−|Vtp| if Vbb ≧VN2≧Vbb−|Vtp|, or Vbb−|Vtp| if VN2≧Vbb. When the voltage level of clock signal Φ2 goes high, the voltage level of node 20 settles at Vbb if VN1≧Vbb−|Vtp|, VN1+|Vtp| if VN1≧Vbb−|Vtp|. FIG. 5 shows the relationship between the voltage levels of clock signal Φ1, Φ2, node N1 and node N2. Table 1 shows the voltage characteristics of the circuit in FIG. 4.

| T26 | Φ2 | VN1 | VN2 | Vnode20 | Comments |
|---|---|---|---|---|---|
| off | low | Vss | don't care | ≦Vbb | Precharge |
| off | high | VN1≦Vbb−\| Vtp\| | Vss | Vbb | |
| off | high | Vbb−\|Vtp\|≦VN1≦Vbb+\| Vtn\|−\| Vtp\| | Vss | VN1+\| Vtp\| | |
| on | high | VN1≧Vbb+\| Vtn\|−\| Vtp\| | Vss | VN1+\| Vtp\| | Slew Condition |

If only one N-channel transistor is programmed in between Vbb and ground (the drain does not have to go to ground, any supply of higher potential than Vbb will do) then the voltage on node 20 only has to get Vtn above Vbb to cause transistor 26 to conduct, thus Vbb would become VN1−Vtn.

If only one N-channel transistor is programmed in between Vbb and ground (the drain does not have to go to ground, any supply of higher potential than Vbb will do) then the voltage on node 20 only has to get Vtn above Vbb to cause transistor 26 to conduct, thus Vbb would become VN1−Vtn.

Being that the minimum possible Vbb voltage for a substrate pump with unbooted P-channel diodes is −Vdd+|Vtp|, this approach makes it possible to make the substrate voltage more shallow with only a Vtn slew down of Vdd. The sensitivity can be made programmable by adding more n-channel transistors in stacked diode configuration from the other of the source/drain of transistor 26 to Vbb.

Thus this circuit has two major improvements over former Vbb slew circuits. First, the circuit has no electron injection into the substrate. Second, the circuit has improved slew sensitivity which can be made programmable to increase or decrease the sensitivity as desired.

Table 1 shows the voltage characteristics of the circuit in FIG. 4.

While this invention has been described with reference to an illustrative embodiment, this description is not to be construed in a limiting sense. For example, this slew circuit may be used in conjunction with substrate pumps other that the one disclosed in FIG. 1. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

We claim:

1. A device, comprising:

a semiconductor substrate;

one of a source/drain of a first transistor connected to a reference voltage, the other of said source/drain of said first transistor directly connected to the gate and one of a source/drain of a second transistor, the other of the source/drain of said second transistor connected to said substrate, and a circuit connected to the gate of said first transistor for controlling the passage of voltage from said one of a source/drain of said first transistor to said gate and said one of a source/drain of said second transistor.

2. The device of claim 1 in which said reference voltage is Vss.

3. The device of claim 1 in which said first transistor is a NMOS transistor.

4. The device of claim 1 in which said second transistor is an NMOS transistor.

5. The device of claim 1 in which said second transistor is an NMOS transistor in stacked diode configuration.

6. The device of claim 1 including a third transistor connected between the other of said source/drain of said second transistor and said substrate.

7. The device of claim 6 in which said third transistor is an NMOS transistor.

8. The device of claim 7 in which the gate and one of a source/drain of said third transistor are connected to said other of the source/drain of said second transistor, the other of the source/drain of said third transistor connected to said substrate.

9. The device of claim 6 including at least one additional transistor connected between the other of said source/drain of said third transistor and said substrate.

10. The device of claim 9 wherein said third transistor and said at least one additional transistor are NMOS transistors.

11. The device of claim 10 wherein said NMOS transistors are in stacked diode configuration.

12. A device, comprising:

a semiconductor device;

one of a source/drain of a first transistor connected to a reference voltage, the other of said source/drain of said first transistor connected to the gate and one of a source/drain of a second transistor, the other of the source/drain of said second transistor connected to said substrate; and a circuit connected to the gate of said first transistor for controlling the passage of voltage form said one of a source/drain of said first transistor to said gate and said one of a source/drain of said second transistor, said circuit comprising one of a source/drain of a third transistor and one of a source/drain of a fourth transistor both coupled to said substrate, the gate of said third transistor coupled to receive a first voltage signal from a substrate pump and the gate of said fourth transistor coupled to receive a second voltage signal from said substrate pump; the other of the source/drain of said third transistor and the other of the source/drain of said fourth coupled to the gate of said first transistor, coupled to a first plate of a capacitor, and coupled to the gate and one of a source/drain of a fifth transistor; the second plate of said capacitor coupled to receive a clock signal, and the other of said source/-drain of said fifth transistor connected to said substrate.

13. The device of claim 12 in which said third transistor is a PMOS transistor.

14. The device of claim 12 in which said fourth transistor is a PMOS transistor.

15. The device of claim 12 in which said fifth transistor is a PMOS transistor.

16. The device of claim 12 in which said first voltage signal and said second voltage signal are generated within the substrate pump.

* * * * *